US012456425B2

(12) United States Patent
Song et al.

(10) Patent No.: US 12,456,425 B2
(45) Date of Patent: Oct. 28, 2025

(54) DISPLAY APPARATUS

(71) Applicant: Samsung Display Co., Ltd., Yongin-si (KR)

(72) Inventors: Hwayoung Song, Yongin-si (KR); Jihyun Ka, Yongin-si (KR); Kimyeong Eom, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/440,062

(22) Filed: Feb. 13, 2024

(65) Prior Publication Data

US 2024/0321201 A1 Sep. 26, 2024

(30) Foreign Application Priority Data

Mar. 24, 2023 (KR) ........................ 10-2023-0039033
May 23, 2023 (KR) ........................ 10-2023-0066477

(51) Int. Cl.

*G09G 3/3233* (2016.01)
*G09G 3/3266* (2016.01)
*H10K 59/131* (2023.01)

(52) U.S. Cl.

CPC ......... *G09G 3/3233* (2013.01); *G09G 3/3266* (2013.01); *H10K 59/131* (2023.02); *G09G 2300/0819* (2013.01); *G09G 2300/0852* (2013.01); *G09G 2300/0861* (2013.01); *G09G 2330/021* (2013.01)

(58) Field of Classification Search

CPC ............... G09G 3/3233; G09G 3/3266; G09G 2300/0819; G09G 2300/0852; G09G 2300/0861; G09G 2330/021; H10K 59/131

See application file for complete search history.

(56) References Cited

U.S. PATENT DOCUMENTS

| | | | | |
|---|---|---|---|---|
| 9,111,491 | B2 | 8/2015 | Woo et al. | |
| 10,991,302 | B1 | 4/2021 | Park et al. | |
| 11,538,415 | B2 | 12/2022 | Shin et al. | |
| 11,610,541 | B1 * | 3/2023 | Kim | G09G 3/3233 |
| 11,615,749 | B2 | 3/2023 | Nam et al. | |
| 2012/0139883 | A1 * | 6/2012 | Lee | G09G 3/3677 327/108 |
| 2013/0113772 | A1 * | 5/2013 | Kang | G09G 3/20 345/211 |

(Continued)

FOREIGN PATENT DOCUMENTS

| | | |
|---|---|---|
| KR | 10-2027169 | 10/2019 |
| KR | 10-2020-0015874 | 2/2020 |

(Continued)

*Primary Examiner* — Nitin Patel
*Assistant Examiner* — Ivelisse Martinez Quiles
(74) *Attorney, Agent, or Firm* — Harness, Dickey & Pierce, P.L.C.

(57) ABSTRACT

A display apparatus includes a pixel, a first scan driving circuit that transmits a first scan signal to the pixel based on a first gate voltage, a second gate voltage having a level lower than a level of the first gate voltage, and a first clock signal, and a second scan driving circuit that transmits a second scan signal to the pixel based on a third gate voltage having a level different from the level of the first gate voltage, a fourth gate voltage having a level lower than the level of the third gate voltage, and a second clock signal.

20 Claims, 5 Drawing Sheets

(56) References Cited

U.S. PATENT DOCUMENTS

| | | | | |
|---|---|---|---|---|
| 2016/0203783 | A1* | 7/2016 | Kim | G09G 3/3677 345/213 |
| 2018/0059497 | A1* | 3/2018 | Lee | G09G 3/3208 |
| 2020/0005708 | A1* | 1/2020 | Hwang | H10K 77/111 |
| 2021/0264857 | A1* | 8/2021 | Wang | G09G 3/3258 |
| 2022/0270546 | A1* | 8/2022 | Kim | G09G 3/3258 |
| 2022/0392382 | A1* | 12/2022 | Park | G09G 3/3233 |
| 2022/0415254 | A1* | 12/2022 | Jeon | G09G 3/3233 |
| 2023/0085612 | A1* | 3/2023 | Park | G09G 3/3233 324/537 |
| 2024/0249661 | A1* | 7/2024 | Jin | G09G 3/2096 |
| 2024/0257720 | A1* | 8/2024 | Yeom | G09G 3/3233 |

FOREIGN PATENT DOCUMENTS

| | | |
|---|---|---|
| KR | 10-2020-0039071 | 4/2020 |
| KR | 10-2021-0082904 | 7/2021 |

* cited by examiner

DISPLAY APPARATUS

CROSS-REFERENCE TO RELATED APPLICATIONS

This application claims priority to and benefits of Korean Patent Application Nos. 10-2023-0039033, filed on Mar. 24, 2023, and 10-2023-0066477, filed on May 23, 2023, under 35 U.S.C. § 119 in the Korean Intellectual Property Office (KIPO), the entire contents of which are incorporated herein by reference.

BACKGROUND

1. Technical Field

Embodiments relate to a display apparatus.

2. Description of the Related Art

Display apparatuses are configured to display data visually. Display apparatuses may be used as displays for small products such as mobile phones or large products such as televisions.

A display apparatus includes a substrate partitioned into a display area and a non-display area. A gate line and a data line are mutually insulated from each other in the display area. A plurality of pixel regions are included in the display area, and pixels arranged in the pixel regions receive electrical signals from gate lines and data lines intersecting each other and emit light to display an image to the outside. A thin-film transistor and a pixel electrode electrically connected to the thin-film transistor are provided in each of the pixel regions, and an opposite electrode is provided in common to the pixel regions. Various lines configured to transmit electrical signals to the pixels in the display area, pads to which a gate driver, a data driver, and a controller are connected, and the like may be provided in the non-display area.

Recently, the usage of display apparatuses has diversified. Also, as display apparatuses have become thinner and more lightweight, the use thereof has additionally expanded. Recently, as the usage of display apparatuses has diversified, various attempts have been made to improve the quality of display apparatuses.

SUMMARY

Embodiments include a display apparatus with reduced power consumption.

The technical objectives to be achieved by the disclosure are not limited to the technical objectives described above, and other technical objectives will be clearly understood by those of ordinary skill in the art from the following description.

Additional aspects will be set forth in part in the description which follows and, in part, will be apparent from the description, or may be learned by practice of the presented embodiments of the disclosure.

According to an embodiment, a display apparatus may include a substrate including a display area and a peripheral area adjacent to the display area, a pixel in the display area, a first conductive line extending in a first direction on a side of the peripheral area and to which a first gate voltage is applied, a second conductive line extending in the first direction on the side of the peripheral area and to which a second gate voltage having a level lower than a level of the first gate voltage is applied, a first clock signal line extending in the first direction on the side of the peripheral area and to which a first clock signal is applied, a third conductive line extending in the first direction on the side of the peripheral area and to which a third gate voltage having a level different from the level of the first gate voltage is applied, a fourth conductive line extending in the first direction on the side of the peripheral area and to which a fourth gate voltage having a level lower than the level of the third gate voltage is applied, a second clock signal line extending in the first direction on the side of the peripheral area and to which a second clock signal is applied, a first scan driving circuit arranged on the side of the peripheral area, electrically connected to the first conductive line, the second conductive line, and the first clock signal line, and transmitting a first scan signal to the pixel based on the first gate voltage, the second gate voltage, and the first clock signal, and a second scan driving circuit arranged on the side of the peripheral area, electrically connected to the third conductive line, the fourth conductive line, and the second clock signal line, and transmitting a second scan signal to the pixel based on the third gate voltage, the fourth gate voltage, and the second clock signal.

According to an embodiment, the pixel may include a display element including an anode and a cathode, a first transistor that controls an amount of a driving current flowing to the display element according to a gate-source voltage of the first transistor, a first capacitor including a first electrode and a second electrode, the first electrode being connected to a gate of the first transistor, a second transistor that transmits a data voltage to the second electrode of the first capacitor in response to the first scan signal, and a third transistor that transmits a first initialization voltage to the anode of the display element in response to the second scan signal.

According to an embodiment, a level of the first gate voltage may be higher than a level of the third gate voltage.

According to an embodiment, the first transistor and the third transistor may each be a p-type metal-oxide semiconductor field effect transistor (MOSFET), and the second transistor may be an n-type MOSFET.

According to an embodiment, the pixel may further include a fourth transistor that applies a first voltage to a source of the first transistor in response to the second scan signal.

According to an embodiment, a level of the fourth gate voltage and a level of the second gate voltage may be different.

According to an embodiment, the display apparatus may further include a third clock signal line extending in the first direction on the side of the peripheral area and to which a third clock signal is applied, a fourth clock signal line extending in the first direction on the side of the peripheral area and to which a fourth clock signal is applied, a fifth clock signal line extending in the first direction on the side of the peripheral area and to which a fifth clock signal is applied, a sixth clock signal line extending in the first direction on the side of the peripheral area and to which a sixth clock signal is applied, a third scan driving circuit arranged on the side of the peripheral area, electrically connected to the first conductive line, the second conductive line, and the third clock signal line, and transmitting a third scan signal to the pixel based on the first gate voltage, the second gate voltage, and the third clock signal, a fourth scan driving circuit arranged on the side of the peripheral area, electrically connected to the first conductive line, the second conductive line, and the fourth clock signal line, and transmitting a fourth scan signal to the pixel based on the first gate voltage, the second gate voltage, and the fourth clock signal, a first emission control driving circuit arranged on the side of the peripheral area, electrically connected to the third conductive line, the fourth conductive line, and the fifth clock signal line, and transmitting a first emission control signal to the pixel based on the third gate voltage, the fourth gate voltage, and the fifth clock signal, and a second emission control driving circuit arranged on the side of the peripheral area, electrically connected to the third conductive line, the fourth conductive line, and the sixth clock signal line, and transmitting a second emission control signal to the pixel based on the third gate voltage, the fourth gate voltage, and the sixth clock signal.

According to an embodiment, the pixel may include a display element including an anode and a cathode, a first transistor that controls an amount of a driving current flowing to the display element according to a gate-source voltage of the first transistor, a first capacitor including a first electrode and a second electrode, the first electrode being connected to a gate of the first transistor, a second transistor that transmits a data voltage to the second electrode of the first capacitor in response to the first scan signal, a third transistor that transmits a first initialization voltage to the anode of the display element in response to the second scan signal, a fourth transistor that applies a first voltage to a source of the first transistor in response to the second scan signal, a fifth transistor that applies a second voltage to the second electrode of the first capacitor in response to the third scan signal, a sixth transistor that connects the source of the first transistor to a drain of the first transistor in response to the third scan signal, a seventh transistor that transmits a second initialization voltage to the gate of the first transistor in response to the fourth scan signal, an eighth transistor that applies a driving voltage to the source of the first transistor in response to the first emission control signal, and a ninth transistor that connects the drain of the first transistor to the anode of the display element in response to the second emission control signal.

According to an embodiment, the pixel may further include a second capacitor including a third electrode connected to the second electrode of the first capacitor and a fourth electrode to which the driving voltage is applied.

According to an embodiment, the first transistor, the third transistor, the fourth transistor, the eighth transistor, and the ninth transistor may each be a p-type MOSFET, and the second transistor, the fifth transistor, the sixth transistor, and the seventh transistor may each be an n-type MOSFET.

According to an embodiment, the first transistor may include a first upper gate connected to the first electrode of the first capacitor and a first lower gate to which the driving voltage is applied, the second transistor may include a second upper gate and a second lower gate connected to each other and to which the first scan signal is applied, the fifth transistor may include a third upper gate and a third lower gate connected to each other and to which the third scan signal is applied, the sixth transistor may include a fourth upper gate and a fourth lower gate connected to each other and to which the third scan signal is applied, and the seventh transistor may include a fifth upper gate and a fifth lower gate connected to each other and to which the fourth scan signal is applied.

According to an embodiment, the fifth clock signal and the sixth clock signal may be substantially identical, the first emission control driving circuit may further receive a first start signal and transmit the first emission control signal to the pixel based on the third gate voltage, the fourth gate voltage, the fifth clock signal, and the first start signal, and the second emission control driving circuit may further receive a second start signal different from the first start signal and transmit the second emission control signal to the pixel based on the third gate voltage, the fourth gate voltage, the sixth clock signal, and the second start signal.

According to an embodiment, a display apparatus may include a pixel connected to first to fourth scan lines that respectively transmits first to fourth scan signals to the pixel, first and second emission control lines that respectively transmits first and second emission control signals to the pixel, a data line that transmits a data voltage to the pixel to the pixel, a power line that transmits a driving voltage to the pixel, first and second voltage lines that respectively transmits first and second initialization voltages to the pixel, and third and fourth voltage lines that respectively transmits first and second voltages to the pixel. The pixel may include a display element including an anode and a cathode, a first capacitor including a first electrode and a second electrode, a second capacitor including a third electrode connected to the second electrode of the first capacitor and a fourth electrode connected to the power line, a first transistor including a gate connected to the first electrode of the first capacitor, a source connected to the power line, and a drain, a second transistor including a gate connected to the first scan line and connecting the data line to the second electrode of the first capacitor in response to the first scan signal, a third transistor including a gate connected to the third scan line and connecting the gate of the first transistor to a drain of the first transistor in response to the third scan signal, a fourth transistor including a gate connected to the fourth scan line and connecting the first voltage line to the gate of the first transistor in response to the fourth scan signal, a fifth transistor including a gate connected to the third scan line and connecting the third voltage line to the second electrode of the first capacitor in response to the third scan signal, a sixth transistor including a gate connected to the first emission control line and connecting the power line to the source of the first transistor in response to the first emission control signal, a seventh transistor including a gate connected to the second emission control line and connecting the drain of the first transistor to the anode of the display element in response to the second emission control signal, an eighth transistor including a gate connected to the second scan line and connecting the second voltage line to the anode of the display element in response to the second scan signal, and a ninth transistor including a gate connected to the second scan line and connecting the fourth voltage line to the source of the first transistor in response to the second scan signal.

According to an embodiment, the first transistor, the sixth transistor, the seventh transistor, the eighth transistor, and the ninth transistor may each be a p-type metal-oxide semiconductor field effect transistor (MOSFET), and the second transistor, the third transistor, the fourth transistor, and the fifth transistor may each be an n-type MOSFET.

According to an embodiment, the display apparatus may further include a substrate including a display area in which the pixel is arranged and a peripheral area adjacent to the display area, a first scan driving circuit arranged on a side of the peripheral area, receiving a first gate voltage, a second gate voltage having a level lower than a level of the first gate voltage, and a first clock signal, and outputting the first scan signal based on the first gate voltage, the second gate voltage, and the first clock signal, a second scan driving circuit arranged on the side of the peripheral area, receiving a third gate voltage having a level different from the level of the first gate voltage, a fourth gate voltage having a level lower than the level of the third gate voltage, and a second clock signal, and outputting the second scan signal based on the third gate voltage, the fourth gate voltage, and the second clock signal, a third scan driving circuit arranged on the side of the peripheral area, receiving the first gate voltage, the second gate voltage, and a third clock signal, and outputting the third scan signal based on the first gate voltage, the second gate voltage, and the third clock signal, a fourth scan driving circuit arranged on the side of the peripheral area, receiving the first gate voltage, the second gate voltage, and a fourth clock signal, and outputting the fourth scan signal based on the first gate voltage, the second gate voltage, and the fourth clock signal, a first emission control driving circuit arranged on the side of the peripheral area, receiving the third gate voltage, the fourth gate voltage, and a fifth clock signal, and outputting the first emission control signal based on the third gate voltage, the fourth gate voltage, and the fifth clock signal, and a second emission control driving circuit arranged on the side of the peripheral area, receiving the third gate voltage, the fourth gate voltage, and a sixth clock signal, and outputting the second emission control signal based on the third gate voltage, the fourth gate voltage, and the sixth clock signal.

According to an embodiment, a level of the first gate voltage may be higher than a level of the third gate voltage.

According to an embodiment, a level of the fourth gate voltage and a level of the second gate voltage may be different.

According to an embodiment, the fifth clock signal and the sixth clock signal may be substantially identical, the first emission control driving circuit may further receive a first start signal and output the first emission control signal based on the third gate voltage, the fourth gate voltage, the fifth clock signal, and the first start signal, and the second emission control driving circuit may further receive a second start signal different from the first start signal and output the second emission control signal based on the third gate voltage, the fourth gate voltage, the sixth clock signal, and the second start signal.

According to an embodiment, the first transistor may further include a lower gate connected to the power line.

According to an embodiment, the gate of each of the second to fifth transistors may include an upper gate and a lower gate connected to each other.

Other aspects, features, and advantages of the disclosure will become better understood through the detailed description, the claims, and the accompanying drawings.

These general and specific aspects may be practiced by using systems, methods, computer programs, or any combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
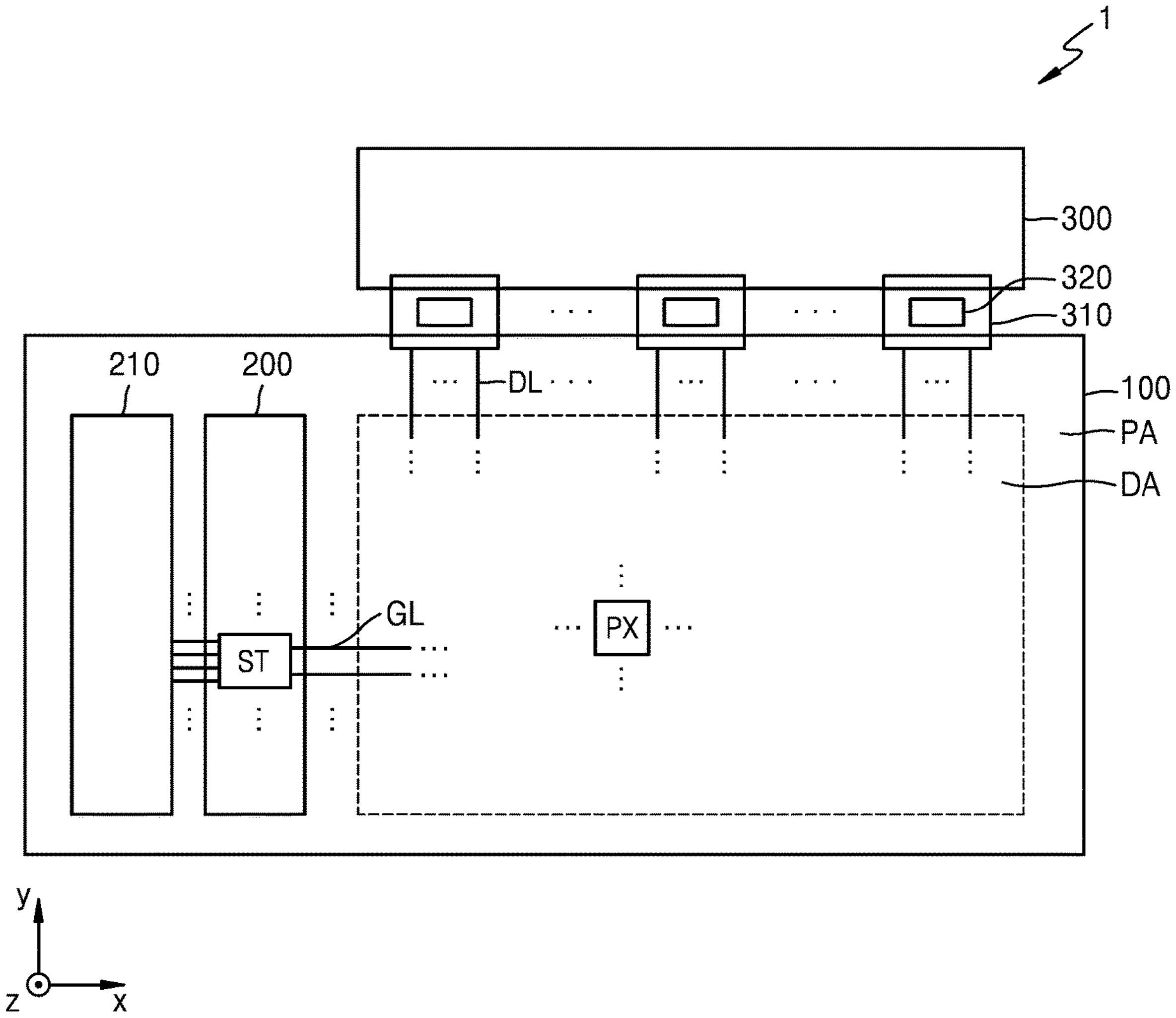
FIG. 1 is a schematic block diagram of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals.

It will be understood that although the terms "first," "second," etc. may be used herein to describe various elements, these elements should not be limited by these terms. These terms are only used to distinguish one element from another.

Throughout the following embodiments, the singular form is intended to include the plural form as well, unless the context clearly indicates otherwise.

It will be further understood that the terms "include" and/or "comprise" used herein specify the presence of stated features or elements, but do not preclude the presence or addition of one or more other features or elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

Throughout the disclosure, the expression "A and B" indicates only A, only B, or both A and B. In this specification, the expression "at least one of A and B" indicates only A, only B, or both A and B.

It will be further understood that when layers, regions, or elements are referred to as being connected to each other, they may be directly connected to each other or indirectly connected to each other with intervening layers, regions, or elements therebetween. For example, when layers, regions, or elements are referred to as being electrically connected to each other, they may be directly electrically connected to each other or indirectly electrically connected to each other with intervening layers, regions, or elements therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic block diagram of a display apparatus 1 according to an embodiment.

Referring to FIG. 1, the display apparatus 1 may include a substrate 100, a gate driver 200, a wiring portion 210, a printed circuit board (PCB) 300, a flexible PCB (FPCB) 310, and a data driver 320.

The substrate 100 may include a display area DA and a peripheral area PA disposed adjacent to the display area DA. The display area DA may be an area in which an image is displayed. A pixel PX including at least one thin-film transistor and a display element may be disposed in the display area DA. The peripheral area PA may be an area in which an image is not displayed. A gate line GL, a data line DL, the gate driver 200, and the wiring portion 210 may be disposed in the peripheral area PA so that voltages and signals are applied to the pixel PX of the display area DA.

A side of the peripheral area PA may be bonded to the FPCB 310 and connected to the PCB 300. The data driver 320, which is mounted on the FPCB 310, may be configured to transmit a data signal (or a data voltage) to the pixel PX of the display area DA through the data line DL. As illustrated in FIG. 1, the data line DL may extend in a first direction (e.g., ±y directions) and may be connected to the pixel PX of the display area DA, and the gate line GL may extend in a second direction (e.g., ±x directions) and may be connected to the pixel PX of the display area DA.

The gate driver 200 may be arranged on a side of the peripheral area PA in the second direction (e.g., ±x directions). The gate driver 200 may be integrated in the peripheral area PA. The gate driver 200 may include multiple stages ST configured to sequentially output a gate signal to the gate line GL. The stages ST may each be connected to at least one gate line GL and configured to transmit the gate signal to the pixel PX.

Figure 3:
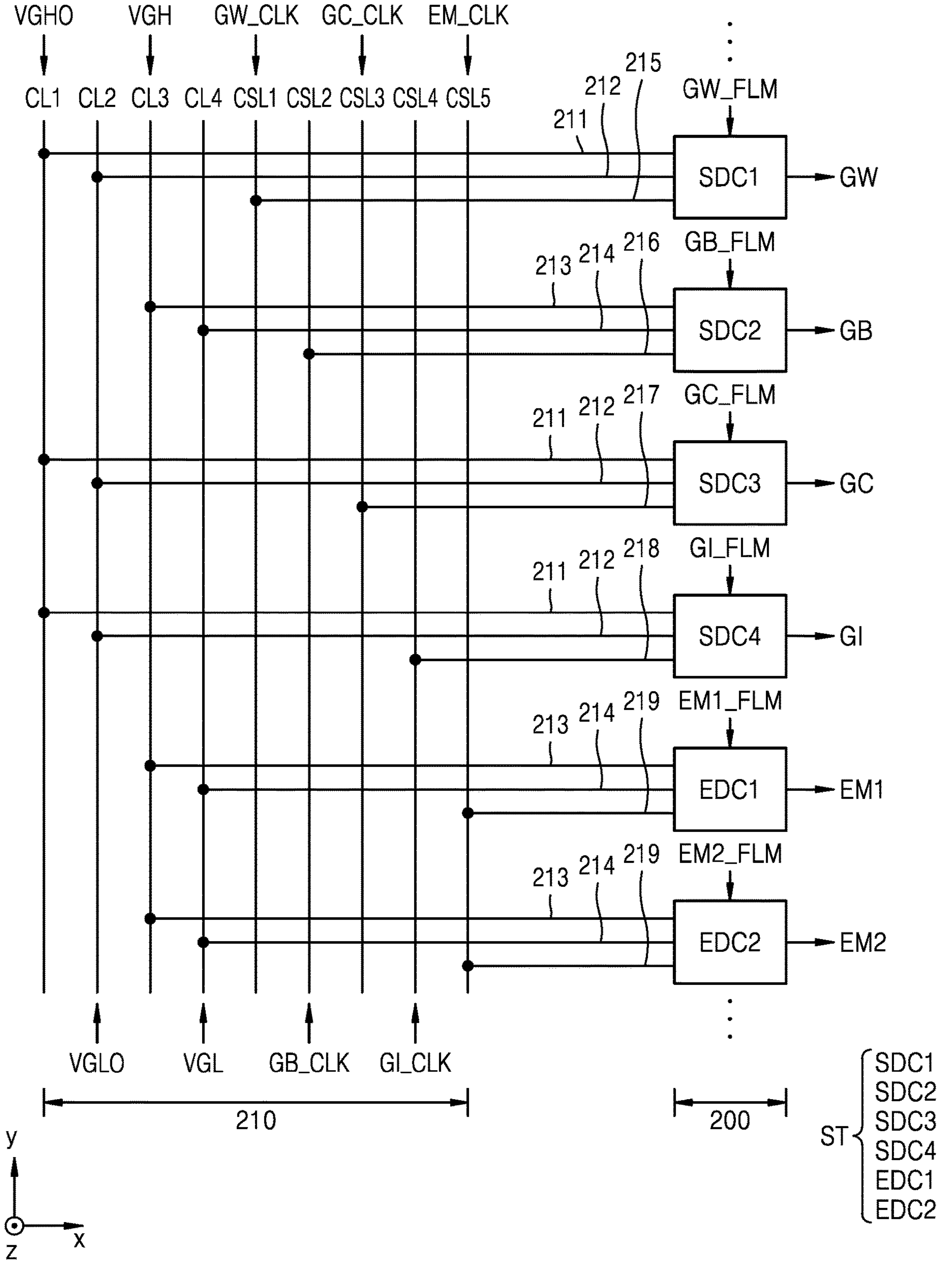
FIG. 3 is a schematic block diagram of a wiring portion and a gate driver according to an embodiment.

In an embodiment, the stages ST may each include multiple driving circuits. For example, as illustrated in FIG. 3 to be described below, the stage ST may include at least one scan driving circuit and at least one emission control driving circuit. The gate line GL, which is connected to the scan driving circuit, may be referred to as a scan line. The gate line GL, which is connected to the emission control driving circuit, may be referred to as an emission control line. The gate signal may include a scan signal and an emission control signal. The scan driving circuit may be connected to the scan line and configured to transmit the scan signal to the pixel PX, and the emission control driving circuit may be connected to the emission control line and configured to transmit the emission control signal to the pixel PX.

The wiring portion 210 may be arranged on a side of the peripheral area PA in the second direction (e.g., ±x directions). The wiring portion 210 may be integrated in the peripheral area PA. The wiring portion 210 may be configured to transmit a gate voltage and/or a clock signal to the stage ST of the gate driver 200. For example, as illustrated in FIG. 3 to be described below, the wiring portion 210 may include at least one conductive line and at least one clock signal line. The at least one conductive line may be configured to transmit the gate voltage to the stage ST of the gate driver 200, and the clock signal line may be configured to transmit the clock signal to the stage ST of the gate driver 200.

The PCB 300, which is located on a side of the FPCB 310, may include a signal controller (not shown). The signal controller may be configured to generate various signals for displaying an image in the display area DA. In order to control the gate driver 200, the wiring portion 210, and the data driver 320, the signal controller may be configured to transmit the control signals to the gate driver 200, the wiring portion 210, and the data driver 320.

Figure 2:
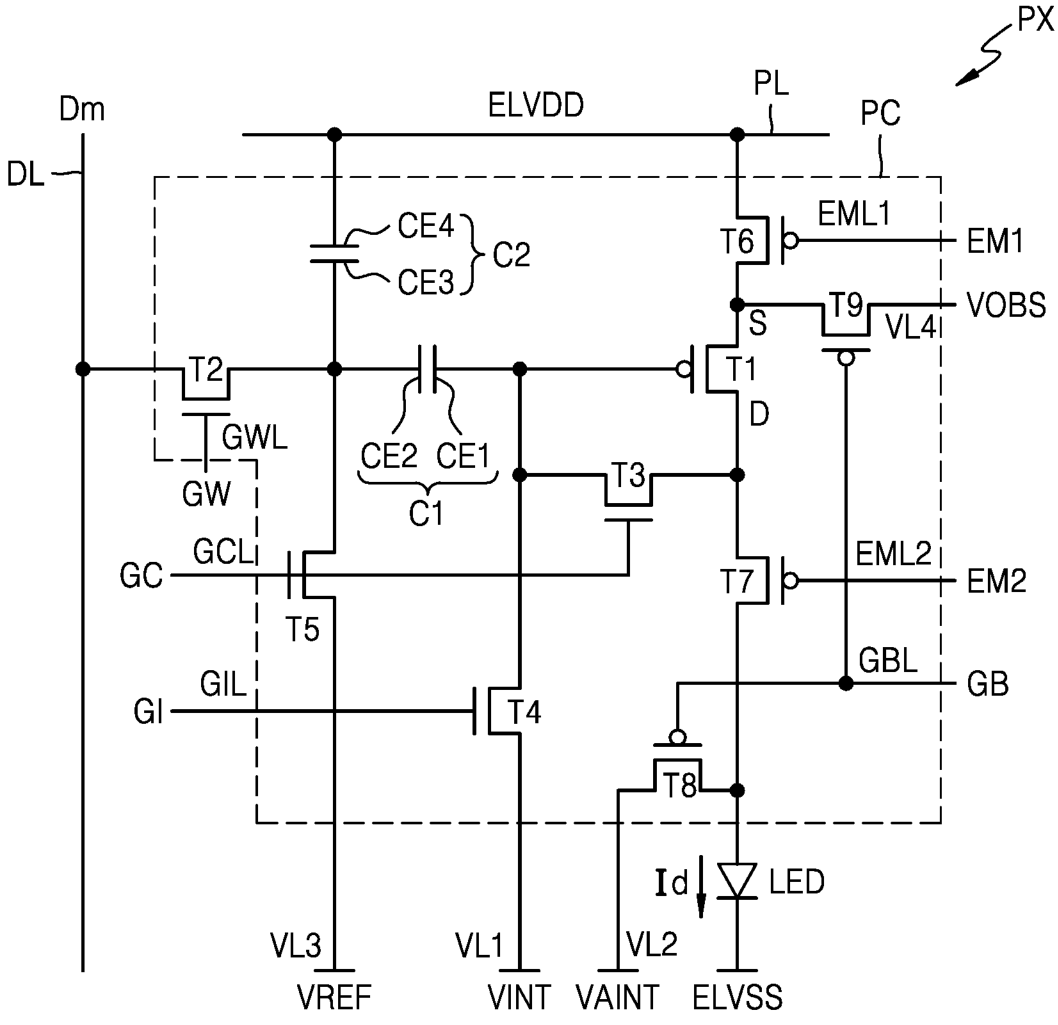
FIG. 2 is a schematic diagram of an equivalent circuit of a pixel according to an embodiment.

FIG. 2 is a schematic diagram of an equivalent circuit of a pixel PX according to an embodiment.

Referring to FIG. 2, the pixel PX may include a pixel circuit PC and a display element LED electrically connected to the pixel circuit PC. The pixel circuit PC may be connected to a first scan line GWL configured to transmit a first scan signal GW, a second scan line GBL configured to transmit a second scan signal GB, a third scan line GCL configured to transmit a third scan signal GC, a fourth scan line GIL configured to transmit a fourth scan signal GI, a first emission control line EML1 configured to transmit a first emission control signal EM1, and a second emission control line EML2 configured to transmit a second emission control signal EM2. The pixel circuit PC may be connected to a data line DL configured to transmit a data voltage Dm, a first voltage line VL1 configured to transmit a first initialization voltage VINT, a second voltage line VL2 configured to transmit a second initialization voltage VAINT, a third voltage line VL3 configured to transmit a first voltage VREF, a fourth voltage line VL4 configured to transmit a second voltage VOBS, and a power line PL configured to transmit a first driving voltage ELVDD. The pixel circuit PC may include first to ninth transistors T1, T2, T3, T4, T5, T6, T7, T8, and T9 and first and second capacitors C1 and C2. The display element LED may be an organic light-emitting diode (OLED). A cathode of the display element LED may be a common electrode to which a second driving voltage ELVSS is applied.

The first transistor T1 may be a driving transistor in which an amount of a drain current is determined according to a gate-source voltage, and the second to ninth transistors T2, T3, T4, T5, T6, T7, T8, and T9 may each be a switching transistor configured to be turned on/off according to a gate-source voltage, substantially a gate voltage. The first to ninth transistors T1, T2, T3, T4, T5, T6, T7, T8, and T9 may each be provided as a thin-film transistor.

In an embodiment, as illustrated in FIG. 2, the first transistor T1, the sixth transistor T6, the seventh transistor T7, the eighth transistor T8, and the ninth transistor T9 may each be provided as a p-channel metal-oxide semiconductor field effect transistor (MOSFET) (PMOS). The second transistor T2, the third transistor T3, the fourth transistor T4, and the fifth transistor T5 may each be provided as an n-channel MOSFET (NMOS).

The first to ninth transistors T1, T2, T3, T4, T5, T6, T7, T8, and T9 may each be an oxide semiconductor thin-film transistor including a semiconductor layer formed of an oxide semiconductor, or a silicon semiconductor thin-film transistor including a semiconductor layer formed of polysilicon.

The first capacitor C1 may be connected between a gate of the first transistor T1 and the second transistor T2. The first capacitor C1 may have a first electrode CE1 connected to the gate of the first transistor T1 and a second electrode CE2 connected to the second transistor T2.

The second capacitor C2 may be connected between the first capacitor C1 and the power line PL. The second capacitor C2 may have a third electrode CE3 connected to the second electrode CE2 of the first capacitor C1 and a fourth electrode CE4 connected to the power line PL.

The first transistor T1 may be configured to control an amount of a driving current Id flowing from the power line PL to the display element LED according to the gate-source voltage of the first transistor T1. The display element LED may be configured to emit light having a certain luminance according to the driving current Id. The first transistor T1 may have the gate connected to the first electrode CE1 of the first capacitor C1, a source S connected to the power line PL, and a drain D electrically connected to the display element LED.

The second transistor T2 may have a gate connected to the first scan line GWL and may be configured to connect the data line DL to the second electrode CE2 of the first capacitor C1 in response to the first scan signal GW. The second transistor T2 may be configured to transmit the data voltage Dm to the second electrode CE2 of the first capacitor C1 in response to the first scan signal GW.

The third transistor T3 may have a gate connected to the third scan line GCL and may be configured to connect the gate and drain D of the first transistor T1 to each other in response to the third scan signal GC.

The fourth transistor T4 may have a gate connected to the fourth scan line GIL and may be configured to connect the first voltage line VL1 to the gate of the first transistor T1 in response to the fourth scan signal GI. The fourth transistor T4 may be configured to transmit the first initialization voltage VINT to the gate of the first transistor T1 in response to the fourth scan signal GI.

The fifth transistor T5 may have a gate connected to the third scan line GCL and may be configured to connect the third voltage line VL3 to the second electrode CE2 of the first capacitor C1 in response to the third scan signal GC. The fifth transistor T5 may be configured to transmit the first voltage VREF to the second electrode CE2 of the first capacitor C1 in response to the third scan signal GC.

The sixth transistor T6 may have a gate connected to the first emission control line EML1 and may be configured to connect the power line PL to the source S of the first transistor T1 in response to the first emission control signal EM1. The sixth transistor T6 may be configured to transmit the first driving voltage ELVDD to the source S of the first transistor T1 in response to the first emission control signal EM1.

The seventh transistor T7 may have a gate connected to the second emission control line EML2 and may be configured to connect the drain D of the first transistor T1 to the anode of the display element LED in response to the second emission control signal EM2.

The eighth transistor T8 may have a gate connected to the second scan line GBL and may be configured to connect the second voltage line VL2 to the anode of the display element LED in response to the second scan signal GB. The eighth transistor T8 may be configured to transmit the second initialization voltage VAINT to the anode of the display element LED in response to the second scan signal GB.

The ninth transistor T9 may have a gate connected to the second scan line GBL and may be configured to connect the fourth voltage line VL4 to the source S of the first transistor T1 in response to the second scan signal GB. The ninth transistor T9 may be configured to transmit the second voltage VOBS to the source S of the first transistor T1 in response to the second scan signal GB.

In an embodiment, the fourth scan signal GI may be substantially synchronized with a third scan signal GC of another row. For example, the fourth scan signal GI may be substantially synchronized with a third scan signal GC of a previous row.

FIG. 2 illustrates that the sixth transistor T6 and the seventh transistor T7 are respectively controlled through the first emission control signal EM1 and the second emission control signal EM2, which are different from each other, however, the disclosure is not limited thereto, and in another embodiment, the sixth transistor T6 and the seventh transistor T7 may be controlled together through a same emission control signal.

FIG. 3 is a schematic block diagram of a wiring portion 210 and a gate driver 200 according to an embodiment.

Referring to FIG. 3, the wiring portion 210 may include first to fourth conductive lines CL1, CL2, CL3, and CL4 and first to fifth clock signal lines CSL1, CSL2, CSL3, CSL4, and CSL5. A stage ST of the gate driver 200 may include first to fourth scan driving circuits SDC1, SDC2, SDC3, and SDC4 and first and second emission control driving circuits EDC1 and EDC2.

The first to fourth conductive lines CL1, CL2, CL3, and CL4 and the first to fifth clock signal lines CSL1, CSL2, CSL3, CSL4, and CSL5 may each extend in the first direction (e.g., ±y directions). The first to fourth conductive lines CL1, CL2, CL3, and CL4 and the first to fifth clock signal lines CSL1, CSL2, CSL3, CSL4, and CSL5 may be sequentially arranged in the second direction (e.g., ±x directions). The positions of the first to fourth conductive lines CL1, CL2, CL3, and CL4 and the first to fifth clock signal lines CSL1, CSL2, CSL3, CSL4, and CSL5 may be changed according to embodiments.

Although FIG. 3 illustrates that the wiring portion 210 includes one first clock signal line CSL1, one second clock signal line CSL2, one third clock signal line CSL3, one fourth clock signal line CSL4, and one fifth clock signal line CSL5, the disclosure is not limited thereto, and the number of clock signal lines may be variously implemented.

A first gate voltage VGHO may be applied to the first conductive line CL1, and a second gate voltage VGLO may be applied to the second conductive line CL2. The first gate voltage VGHO and the second gate voltage VGLO may control a switching transistor of the pixel PX. In case that the first gate voltage VGHO is applied to a gate of a switching transistor, the switching transistor may be turned on. In case that the second gate voltage VGLO is applied to the gate of the switching transistor, the switching transistor may be turned off. The first gate voltage VGHO may be a gate-on voltage, and the second gate voltage VGLO may be a gate-off voltage. The switching transistor of the pixel PX may be an n-type MOSFET, and the level of the second gate voltage VGLO may be lower than the level of the first gate voltage VGHO.

A third gate voltage VGH may be applied to the third conductive line CL3, and a fourth gate voltage VGL may be applied to the fourth conductive line CL4. The third gate voltage VGH and the fourth gate voltage VGL may control a switching transistor of the pixel PX. In case that the third gate voltage VGH is applied to a gate of a switching transistor, the switching transistor is turned off. In case that the fourth gate voltage VGL is applied to the gate of the switching transistor, the switching transistor may be turned on. The third gate voltage VGH may be a gate-off voltage, and the fourth gate voltage VGL may be a gate-on voltage. The switching transistor of the pixel PX may be a p-type MOSFET, and the level of the fourth gate voltage VGL may be lower than the level of the third gate voltage VGH.

In an embodiment, the level of the first gate voltage VGHO may be different from the level of the third gate voltage VGH. For example, the level of the first gate voltage VGHO may be higher than the level of the third gate voltage VGH. The level of the first gate voltage VGHO may be higher than the level of the third gate voltage VGH by a threshold voltage (Vth) of the n-type MOSFET.

In an embodiment, the level of the second gate voltage VGLO and the level of the fourth gate voltage VGL may be different from each other.

As described above with reference to FIG. 2, the pixel PX according to an embodiment may include an n-type MOSFET and a p-type MOSFET. In case that the data voltage Dm and the first voltage VREF respectively applied to the second transistor T2 and the fifth transistor T5 are positive, it may be necessary to increase the gate-on voltage for turning on the n-type MOSFET by a threshold voltage (Vth) of the n-type MOSFET, compared to the p-type MOSFET. In case that a same gate voltage is used to control the n-type MOSFET and the p-type MOSFET, unnecessary power consumption may occur as controlling the p-type MOSFET. Therefore, as in the embodiment, in case that the gate voltages for controlling the n-type MOSFET and the p-type MOSFET are separated from each other, power consumption of the display apparatus (see 1 of FIG. 1) may be reduced.

The first conductive line CL1 may be electrically connected to a first connection line 211 extending in the second direction (e.g., ±x directions). The first connection lines 211 may be connected to the first scan driving circuit SDC1, the third scan driving circuit SDC3, and the fourth scan driving circuit SDC4 and configured to transmit the first gate voltage VGHO from the first conductive line CL1 to the first scan driving circuit SDC1, the third scan driving circuit SDC3, and the fourth scan driving circuit SDC4.

The second conductive line CL2 may be electrically connected to a second connection line 212 extending in the second direction (e.g., ±x directions). The second connection lines 212 may be connected to the first scan driving circuit SDC1, the third scan driving circuit SDC3, and the fourth scan driving circuit SDC4 and configured to transmit the second gate voltage VGLO from the second conductive line CL2 to the first scan driving circuit SDC1, the third scan driving circuit SDC3, and the fourth scan driving circuit SDC4.

The third conductive line CL3 may be electrically connected to a third connection line 213 extending in the second direction (e.g., ±x directions). The third connection lines 213 may be connected to the second scan driving circuit SDC2, the first emission control driving circuit EDC1, and the second emission control driving circuit EDC2 and configured to transmit the third gate voltage VGH from the third conductive line CL3 to the second scan driving circuit SDC2, the first emission control driving circuit EDC1, and the second emission control driving circuit EDC2.

The fourth conductive line CL4 may be electrically connected to a fourth connection line 214 extending in the second direction (e.g., ±x directions). The fourth connection lines 214 may be connected to the second scan driving circuit SDC2, the first emission control driving circuit EDC1, and the second emission control driving circuit EDC2 and configured to transmit the fourth gate voltage VGL from the fourth conductive line CL4 to the second scan driving circuit SDC2, the first emission control driving circuit EDC1, and the second emission control driving circuit EDC2.

A first clock signal GW_CLK may be applied to the first clock signal line CSL1, a second clock signal GB_CLK may be applied to the second clock signal line CSL2, and a third clock signal GC_CLK may be applied to the third clock signal line CSL3. A fourth clock signal GI_CLK may be applied to the fourth clock signal line CSL4, and a fifth clock signal EM_CLK may be applied to the fifth clock signal line CSL5.

The first clock signal line CSL1 may be electrically connected to a fifth connection line 215 extending in the second direction (e.g., ±x directions). The fifth connection line 215 may be connected to the first scan driving circuit SDC1 and configured to transmit the first clock signal GW_CLK from the first clock signal line CSL1 to the first scan driving circuit SDC1.

The second clock signal line CSL2 may be electrically connected to a sixth connection line 216 extending in the second direction (e.g., ±x directions). The sixth connection line 216 may be connected to the second scan driving circuit SDC2 and configured to transmit the second clock signal GB_CLK from the second clock signal line CSL2 to the second scan driving circuit SDC2.

The third clock signal line CSL3 may be electrically connected to a seventh connection line 217 extending in the second direction (e.g., ±x directions). The seventh connection line 217 may be connected to the third scan driving circuit SDC3 and configured to transmit the third clock signal GC_CLK from the third clock signal line CSL3 to the third scan driving circuit SDC3.

The fourth clock signal line CSL4 may be electrically connected to an eighth connection line 218 extending in the second direction (e.g., ±x directions). The eighth connection line 218 may be connected to the fourth scan driving circuit SDC4 and configured to transmit the fourth clock signal GI_CLK from the fourth clock signal line CSL4 to the fourth scan driving circuit SDC4.

The fifth clock signal line CSL5 may be electrically connected to a ninth connection line 219 extending in the second direction (e.g., ±x directions). The ninth connection lines 219 may be respectively connected to the first emission control driving circuit EDC1 and the second emission control driving circuit EDC2 and configured to transmit the fifth clock signal EM_CLK from the fifth clock signal line CSL5 to the first emission control driving circuit EDC1 and the second emission control driving circuit EDC2.

The first scan driving circuit SDC1 may be configured to receive the first gate voltage VGHO, the second gate voltage VGLO, the first clock signal GW_CLK, and a first start signal GW_FLM and output the first scan signal GW based on the first gate voltage VGHO, the second gate voltage VGLO, the first clock signal GW_CLK, and the first start signal GW_FLM. The first scan line GWL of FIG. 2 may be configured to connect the first scan driving circuit SDC1 to the pixel PX, and the first scan driving circuit SDC1 may be configured to transmit the first scan signal GW to the pixel PX through the first scan line GWL.

The second scan driving circuit SDC2 may be configured to receive the third gate voltage VGH, the fourth gate voltage VGL, the second clock signal GB_CLK, and a second start signal GW_FLM and output the second scan signal GB based on the third gate voltage VGH, the fourth gate voltage VGL, the second clock signal GB_CLK, and the second start signal GB_FLM. The second scan line GBL of FIG. 2 may be configured to connect the second scan driving circuit SDC2 to the pixel PX, and the second scan driving circuit SDC2 may be configured to transmit the second scan signal GB to the pixel PX through the second scan line GBL.

The third scan driving circuit SDC3 may be configured to receive the first gate voltage VGHO, the second gate voltage VGLO, the third clock signal GC_CLK, and a third start signal GC_FLM and output the third scan signal GC based on the first gate voltage VGHO, the second gate voltage VGLO, the third clock signal GC_CLK, and the third start signal GC_FLM. The third scan line GCL of FIG. 2 may be configured to connect the third scan driving circuit SDC3 to the pixel PX, and the third scan driving circuit SDC3 may be configured to transmit the third scan signal GC to the pixel PX through the third scan line GCL.

The fourth scan driving circuit SDC4 may be configured to receive the first gate voltage VGHO, the second gate voltage VGLO, the fourth clock signal GI_CLK, and a fourth start signal GI_FLM and output the fourth scan signal GI based on the first gate voltage VGHO, the second gate voltage VGLO, the fourth clock signal GI_CLK, and the fourth start signal GI_FLM. The fourth scan line GIL of FIG. 2 may be configured to connect the fourth scan driving circuit SDC4 to the pixel PX, and the fourth scan driving circuit SDC4 may be configured to transmit the fourth scan signal GI to the pixel PX through the fourth scan line GIL.

The first emission control driving circuit EDC1 may be configured to receive the third gate voltage VGH, the fourth gate voltage VGL, the fifth clock signal EM_CLK, and a fifth start signal EM1_FLM and output the first emission control signal EM1 based on the third gate voltage VGH, the fourth gate voltage VGL, the fifth clock signal EM_CLK, and the fifth start signal EM1_FLM. The first emission control line EML1 of FIG. 2 may be configured to connect the first emission control driving circuit EDC1 to the pixel PX, and the first emission control driving circuit EDC1 may be configured to transmit the first emission control signal EM1 to the pixel PX through the first emission control line EML1.

The second emission control driving circuit EDC2 may be configured to receive the third gate voltage VGH, the fourth gate voltage VGL, the fifth clock signal EM_CLK, and a sixth start signal EM2_FLM and output the second emission control signal EM2 based on the third gate voltage VGH, the fourth gate voltage VGL, the fifth clock signal EM_CLK, and the sixth start signal EM2_FLM. The second emission control line EML2 of FIG. 2 may be configured to connect the second emission control driving circuit EDC2 to the pixel PX, and the second emission control driving circuit EDC2 may be configured to transmit the second emission control signal EM2 to the pixel PX through the second emission control line EML2.

In an embodiment, the first start signal GW_FLM may be a first scan signal GW of a previous row. The second start signal GB_FLM may be a second scan signal GB of the previous row. The third start signal GC_FLM may be a third scan signal GC of the previous row. The fourth start signal GI_FLM may be a fourth scan signal GI of the previous row. The fifth start signal EM1_FLM may be a first emission control signal EM1 of the previous row. The sixth start signal EM2_FLM may be a second emission control signal EM2 of the previous row.

In another embodiment, the first start signal GW_FLM may be a first scan signal GW of a next row. The second start signal GB_FLM may be a second scan signal GB of the next row. The third start signal GC_FLM may be a third scan signal GC of the next row. The fourth start signal GI_FLM may be a fourth scan signal GI of the next row. The fifth start signal EM1_FLM may be a first emission control signal EM1 of the next row. The sixth start signal EM2_FLM may be a second emission control signal EM2 of the next row.

Figure 4:
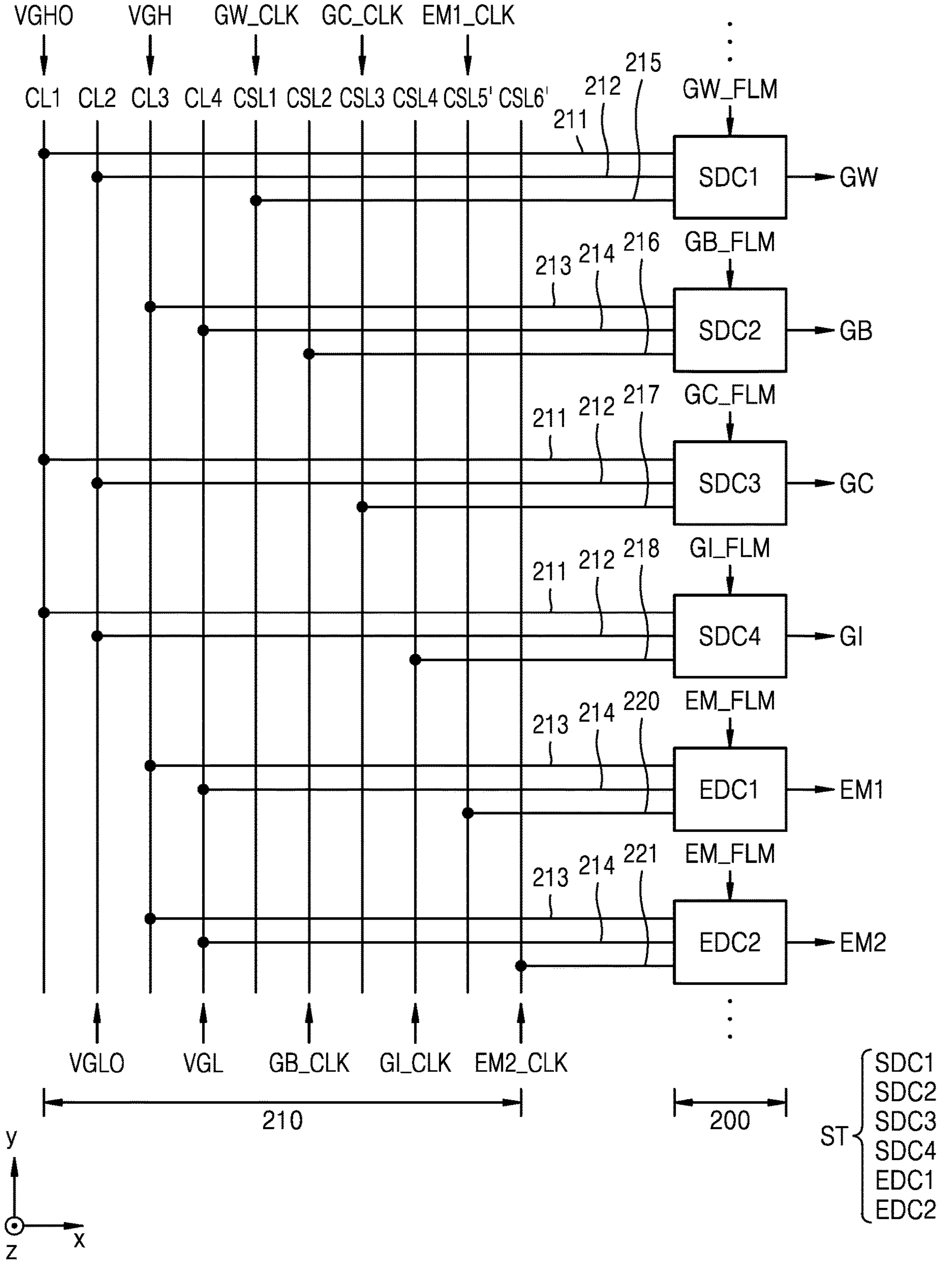
FIG. 4 is a schematic block diagram of a wiring portion and a gate driver according to another embodiment.

FIG. 4 is a schematic block diagram of a wiring portion 210 and a gate driver 200 according to another embodiment. FIG. 4 is a modification of FIG. 3 and differs from FIG. 3 in view of the structure of the wiring portion 210. Hereinafter, descriptions previously given with respect to FIG. 3 are omitted, and the differences are described.

Referring to FIG. 4, the wiring portion 210 may include a fifth clock signal line CSL5' and a sixth clock signal line CSL6'. The fifth clock signal line CSL5' and the sixth clock signal line CSL6' may each extend in the first direction (e.g., ±y directions). Although FIG. 4 illustrates that the wiring portion 210 includes one fifth clock signal line CSL5' and one sixth clock signal line CSL6', the disclosure is not limited thereto, and the number of clock signal lines may be variously implemented.

A fifth clock signal EM1_CLK may be applied to the fifth clock signal line CSL5', and a sixth clock signal EM2_CLK may be applied to the sixth clock signal line CSL6'. The fifth clock signal line CSL5' may be electrically connected to a tenth connection line 220 extending in the second direction (e.g., ±x directions). The tenth connection line 220 may be connected to a first emission control driving circuit EDC1 and configured to transmit the fifth clock signal EM1_CLK from the fifth clock signal line CSL5' to the first emission control driving circuit EDC1. The sixth clock signal line CSL6' may be electrically connected to an eleventh connection line 221 extending in the second direction (e.g., ±x directions). The eleventh connection line 221 may be connected to a second emission control driving circuit EDC2 and configured to transmit the sixth clock signal EM2_CLK from the sixth clock signal line CSL6' to the second emission control driving circuit EDC2.

The first emission control driving circuit EDC1 may be configured to receive a third gate voltage VGH, a fourth gate voltage VGL, the fifth clock signal EM1_CLK, and a seventh start signal EM_FLM and output a first emission control signal EM1 based on the third gate voltage VGH, the fourth gate voltage VGL, the fifth clock signal EM1_CLK, and the seventh start signal EM_FLM. The first emission control line EML1 of FIG. 2 may be configured to connect the first emission control driving circuit EDC1 to the pixel PX, and the first emission control driving circuit EDC1 may be configured to transmit the first emission control signal EM1 to the pixel PX through the first emission control line EML1.

The second emission control driving circuit EDC2 may be configured to receive the third gate voltage VGH, the fourth gate voltage VGL, the sixth clock signal EM2_CLK, and the seventh start signal EM_FLM and output the second emission control signal EM2 based on the third gate voltage VGH, the fourth gate voltage VGL, the sixth clock signal EM2_CLK, and the seventh start signal EM_FLM. The second emission control line EML2 of FIG. 2 may be configured to connect the second emission control driving circuit EDC2 to the pixel PX, and the second emission control driving circuit EDC2 may be configured to transmit the second emission control signal EM2 to the pixel PX through the second emission control line EML2.

Figure 5:
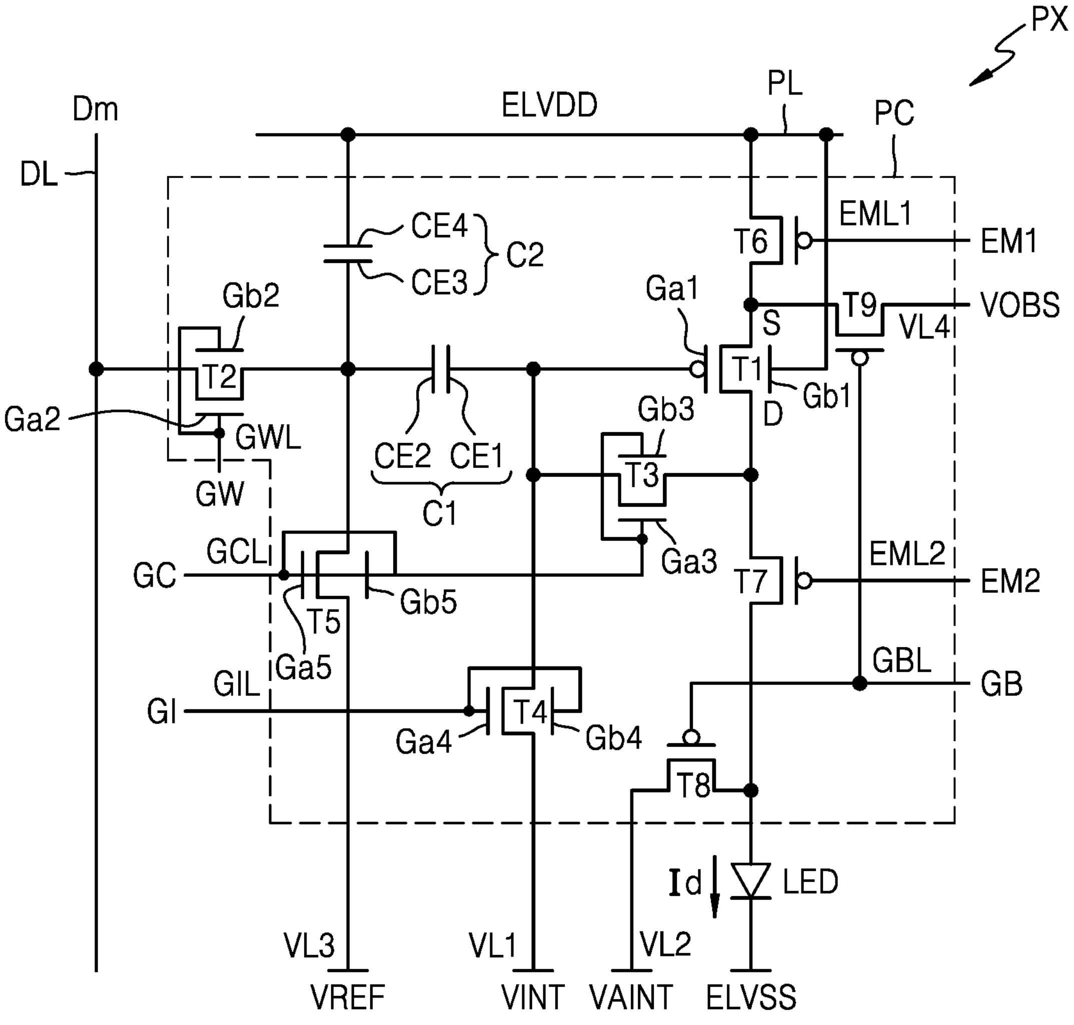
FIG. 5 is a schematic diagram of an equivalent circuit of a pixel according to another embodiment.

FIG. 5 is a schematic diagram of an equivalent circuit of a pixel PX according to another embodiment. FIG. 5 is a modification of FIG. 2 and differs from FIG. 2 in view of structures of some transistors. Hereinafter, descriptions previously given with respect to FIG. 2 are omitted, and the differences are described.

Referring to FIG. 5, a first transistor T1 may include a first upper gate Ga1 and a first lower gate Gb1. The first upper gate Ga1 corresponds to the gate of the first transistor T1 of FIG. 2 described above. The first lower gate Gb1 may be connected to a power line PL, and a first driving voltage ELVDD may be applied to the first lower gate Gb1.

A gate of each of second to fifth transistors T2, T3, T4, and T5 may include an upper gate and a lower gate, which are connected to each other. For example, as illustrated in FIG. 5, the second transistor T2 may include a second upper gate Ga2 and a second lower gate Gb2, which are connected to each other. The third transistor T3 may include a third upper gate Ga3 and a third lower gate Gb3, which are connected to each other. The fourth transistor T4 may include a fourth upper gate Ga4 and a fourth lower gate Gb4, which are connected to each other. The fifth transistor T5 may include a fifth upper gate Ga5 and a fifth lower gate Gb5, which are connected to each other. As such, in case that the upper gate and the lower gate of each of the switching transistors are connected to each other, electron mobility in the transistor may be improved.

The display apparatus has been described above, but the disclosure is not limited thereto. For example, a method of manufacturing the display apparatus also falls within the scope of the disclosure.

According to embodiments, a display apparatus with reduced power consumption may be implemented. The scope of the disclosure is not limited by such an effect.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display apparatus comprising:
- a substrate including a display area and a peripheral area adjacent to the display area;
- a pixel in the display area;
- a first conductive line extending in a first direction on a side of the peripheral area and to which a first gate voltage is applied;
- a second conductive line extending in the first direction on the side of the peripheral area and to which a second gate voltage having a level lower than a level of the first gate voltage is applied;
- a first clock signal line extending in the first direction on the side of the peripheral area and to which a first clock signal is applied;
- a third conductive line extending in the first direction on the side of the peripheral area and to which a third gate voltage having a level different from the level of the first gate voltage is applied;
- a fourth conductive line extending in the first direction on the side of the peripheral area and to which a fourth gate voltage having a level lower than the level of the third gate voltage is applied;
- a second clock signal line extending in the first direction on the side of the peripheral area and to which a second clock signal is applied;
- a first scan driving circuit arranged on the side of the peripheral area, electrically connected to the first conductive line, the second conductive line, and the first clock signal line, and transmitting a first scan signal to the pixel based on the first gate voltage, the second gate voltage, and the first clock signal; and
- a second scan driving circuit arranged on the side of the peripheral area, electrically connected to the third conductive line, the fourth conductive line, and the second clock signal line, and transmitting a second scan signal to the pixel based on the third gate voltage, the fourth gate voltage, and the second clock signal.

2. The display apparatus of claim 1, wherein the pixel comprises:
- a display element comprising an anode and a cathode;
- a first transistor that controls an amount of a driving current flowing to the display element according to a gate-source voltage of the first transistor;
- a first capacitor comprising a first electrode and a second electrode, the first electrode being connected to a gate of the first transistor;
- a second transistor that transmits a data voltage to the second electrode of the first capacitor in response to the first scan signal; and
- a third transistor that transmits a first initialization voltage to the anode of the display element in response to the second scan signal.

3. The display apparatus of claim 2, wherein the level of the first gate voltage is higher than the level of the third gate voltage.

4. The display apparatus of claim 2, wherein
- the first transistor and the third transistor are each a p-type metal-oxide semiconductor field effect transistor (MOSFET), and
- the second transistor is an n-type MOSFET.

5. The display apparatus of claim 2, wherein the pixel further comprises a fourth transistor that applies a first voltage to a source of the first transistor in response to the second scan signal.

6. The display apparatus of claim 1, wherein the level of the fourth gate voltage and the level of the second gate voltage are different.

7. The display apparatus of claim 1, further comprising:
- a third clock signal line extending in the first direction on the side of the peripheral area and to which a third clock signal is applied;
- a fourth clock signal line extending in the first direction on the side of the peripheral area and to which a fourth clock signal is applied;

a fifth clock signal line extending in the first direction on the side of the peripheral area and to which a fifth clock signal is applied;

a sixth clock signal line extending in the first direction on the side of the peripheral area and to which a sixth clock signal is applied;

a third scan driving circuit arranged on the side of the peripheral area, electrically connected to the first conductive line, the second conductive line, and the third clock signal line, and transmitting a third scan signal to the pixel based on the first gate voltage, the second gate voltage, and the third clock signal;

a fourth scan driving circuit arranged on the side of the peripheral area, electrically connected to the first conductive line, the second conductive line, and the fourth clock signal line, and transmitting a fourth scan signal to the pixel based on the first gate voltage, the second gate voltage, and the fourth clock signal;

a first emission control driving circuit arranged on the side of the peripheral area, electrically connected to the third conductive line, the fourth conductive line, and the fifth clock signal line, and transmitting a first emission control signal to the pixel based on the third gate voltage, the fourth gate voltage, and the fifth clock signal; and a second emission control driving circuit arranged on the side of the peripheral area, electrically connected to the third conductive line, the fourth conductive line, and the sixth clock signal line, and transmitting a second emission control signal to the pixel based on the third gate voltage, the fourth gate voltage, and the sixth clock signal.

8. The display apparatus of claim 7, wherein the pixel comprises:

a display element comprising an anode and a cathode;

a first transistor that controls an amount of a driving current flowing to the display element according to a gate-source voltage of the first transistor;

a first capacitor comprising a first electrode and a second electrode, the first electrode being connected to a gate of the first transistor;

a second transistor that transmits a data voltage to the second electrode of the first capacitor in response to the first scan signal;

a third transistor that transmits a first initialization voltage to the anode of the display element in response to the second scan signal;

a fourth transistor that applies a first voltage to a source of the first transistor in response to the second scan signal;

a fifth transistor that applies a second voltage to the second electrode of the first capacitor in response to the third scan signal;

a sixth transistor that connects the gate of the first transistor to a drain of the first transistor in response to the third scan signal;

a seventh transistor that transmits a second initialization voltage to the gate of the first transistor in response to the fourth scan signal;

an eighth transistor that applies a driving voltage to the source of the first transistor in response to the first emission control signal; and a ninth transistor that connects the drain of the first transistor to the anode of the display element in response to the second emission control signal.

9. The display apparatus of claim 8, wherein the pixel further comprises a second capacitor comprising a third electrode connected to the second electrode of the first capacitor and a fourth electrode to which the driving voltage is applied.

10. The display apparatus of claim 8, wherein the first transistor, the third transistor, the fourth transistor, the eighth transistor, and the ninth transistor are each a p-type MOSFET, and the second transistor, the fifth transistor, the sixth transistor, and the seventh transistor are each an n-type MOSFET.

11. The display apparatus of claim 8, wherein the first transistor comprises a first upper gate connected to the first electrode of the first capacitor and a first lower gate to which the driving voltage is applied, the second transistor comprises a second upper gate and a second lower gate connected to each other and to which the first scan signal is applied, the fifth transistor comprises a third upper gate and a third lower gate connected to each other and to which the third scan signal is applied, the sixth transistor comprises a fourth upper gate and a fourth lower gate connected to each other and to which the third scan signal is applied, and the seventh transistor comprises a fifth upper gate and a fifth lower gate connected to each other and to which the fourth scan signal is applied.

12. The display apparatus of claim 7, wherein the fifth clock signal and the sixth clock signal are substantially identical, the first emission control driving circuit further receives a first start signal and transmits the first emission control signal to the pixel based on the third gate voltage, the fourth gate voltage, the fifth clock signal, and the first start signal, and the second emission control driving circuit further receives a second start signal different from the first start signal and transmits the second emission control signal to the pixel based on the third gate voltage, the fourth gate voltage, the sixth clock signal, and the second start signal.

13. A display apparatus comprising a pixel connected to:

first to fourth scan lines that respectively transmits first to fourth scan signals to the pixel;

first and second emission control lines that respectively transmits first and second emission control signals to the pixel;

a data line that transmits a data voltage to the pixel;

a power line that transmits a driving voltage to the pixel;

first and second voltage lines that respectively transmits first and second initialization voltages to the pixel; and third and fourth voltage lines that respectively transmits first and second voltages to the pixel, wherein the pixel comprises:

a display element comprising an anode and a cathode;

a first capacitor comprising a first electrode and a second electrode;

a second capacitor comprising a third electrode connected to the second electrode of the first capacitor and a fourth electrode connected to the power line;

a first transistor comprising a gate connected to the first electrode of the first capacitor, a source connected to the power line, and a drain;

a second transistor comprising a gate connected to the first scan line and connecting the data line to the second electrode of the first capacitor in response to the first scan signal;

a third transistor comprising a gate connected to the third scan line and connecting the gate of the first transistor to the drain of the first transistor in response to the third scan signal;

a fourth transistor comprising a gate connected to the fourth scan line and connecting the first voltage line to the gate of the first transistor in response to the fourth scan signal;

a fifth transistor comprising a gate connected to the third scan line and connecting the third voltage line to the second electrode of the first capacitor in response to the third scan signal;

a sixth transistor comprising a gate connected to the first emission control line and connecting the power line to the source of the first transistor in response to the first emission control signal;

a seventh transistor comprising a gate connected to the second emission control line and connecting the drain of the first transistor to the anode of the display element in response to the second emission control signal;

an eighth transistor comprising a gate connected to the second scan line and connecting the second voltage line to the anode of the display element in response to the second scan signal;

a ninth transistor comprising a gate connected to the second scan line and connecting the fourth voltage line to the source of the first transistor in response to the second scan signal;

a substrate including a display area in which the pixel is arranged and a peripheral area adjacent to the display area;

a first scan driving circuit arranged on a side of the peripheral area, receiving a first gate voltage, a second gate voltage having a level lower than a level of the first gate voltage, and a first clock signal, and outputting the first scan signal based on the first gate voltage, the second gate voltage, and the first clock signal; and a second scan driving circuit arranged on the side of the peripheral area, receiving a third gate voltage having a level different from the level of the first gate voltage, a fourth gate voltage having a level lower than the level of the third gate voltage, and a second clock signal, and outputting the second scan signal based on the third gate voltage, the fourth gate voltage, and the second clock signal.

14. The display apparatus of claim 13, wherein the first transistor, the sixth transistor, the seventh transistor, the eighth transistor, and the ninth transistor are each a p-type metal-oxide semiconductor field effect transistor (MOSFET), and the second transistor, the third transistor, the fourth transistor, and the fifth transistor are each an n-type MOSFET.

15. The display apparatus of claim 13, further comprising:

a third scan driving circuit arranged on the side of the peripheral area, receiving the first gate voltage, the second gate voltage, and a third clock signal, and outputting the third scan signal based on the first gate voltage, the second gate voltage, and the third clock signal;

a fourth scan driving circuit arranged on the side of the peripheral area, receiving the first gate voltage, the second gate voltage, and a fourth clock signal, and outputting the fourth scan signal based on the first gate voltage, the second gate voltage, and the fourth clock signal;

a first emission control driving circuit arranged on the side of the peripheral area, receiving the third gate voltage, the fourth gate voltage, and a fifth clock signal, and outputting the first emission control signal based on the third gate voltage, the fourth gate voltage, and the fifth clock signal; and a second emission control driving circuit arranged on the side of the peripheral area, receiving the third gate voltage, the fourth gate voltage, and a sixth clock signal, and outputting the second emission control signal based on the third gate voltage, the fourth gate voltage, and the sixth clock signal.

16. The display apparatus of claim 15, wherein the level of the first gate voltage is higher than the level of the third gate voltage.

17. The display apparatus of claim 15, wherein the level of the fourth gate voltage and the level of the second gate voltage are different.

18. The display apparatus of claim 15, wherein the fifth clock signal and the sixth clock signal are substantially identical, the first emission control driving circuit further receives a first start signal and outputs the first emission control signal based on the third gate voltage, the fourth gate voltage, the fifth clock signal, and the first start signal, and the second emission control driving circuit further receives a second start signal different from the first start signal and outputs the second emission control signal based on the third gate voltage, the fourth gate voltage, the sixth clock signal, and the second start signal.

19. The display apparatus of claim 13, wherein the first transistor further comprises a lower gate connected to the power line.

20. The display apparatus of claim 13, wherein the gate of each of the second to fifth transistors comprises an upper gate and a lower gate connected to each other.

* * * * *